United States Patent
Imai

(10) Patent No.: US 7,646,657 B2
(45) Date of Patent: Jan. 12, 2010

(54) SEMICONDUCTOR MEMORY DEVICE HAVING REPLICA CIRCUIT

(75) Inventor: Kimimasa Imai, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 69 days.

(21) Appl. No.: 11/945,830

(22) Filed: Nov. 27, 2007

(65) Prior Publication Data

US 2008/0123387 A1    May 29, 2008

(30) Foreign Application Priority Data

Nov. 28, 2006  (JP) .............................. 2006-320352

(51) Int. Cl.
*G11C 7/02*  (2006.01)

(52) U.S. Cl. .................. 365/210; 365/230.06; 365/193; 365/194

(58) Field of Classification Search ................. 365/210, 365/230.06, 193, 194
See application file for complete search history.

(56) References Cited

U.S. PATENT DOCUMENTS

| | | | |
|---|---|---|---|
| 4,680,735 A | | 7/1987 | Miyamoto et al. |
| 5,642,326 A | * | 6/1997 | Sakurai et al. ......... 365/230.06 |
| 5,657,269 A | * | 8/1997 | Nanamiya ............... 365/185.17 |
| 7,002,857 B2 | * | 2/2006 | Kang ......................... 365/194 |
| 7,035,149 B2 | | 4/2006 | Shimizu |
| 2006/0239094 A1 | | 10/2006 | Maki et al. |

FOREIGN PATENT DOCUMENTS

JP    2002-056682    2/2002

* cited by examiner

*Primary Examiner*—Connie C Yoha
(74) *Attorney, Agent, or Firm*—Turocy & Watson, LLP

(57) ABSTRACT

A semiconductor memory device includes a memory cell array, word line, row decoder, bit line, sense amplifier, dummy cell array, dummy bit line, sense amplifier activation circuit, and signal interconnection. The word line is connected to memory cells arrayed in the column direction. The row decoder is connected to the word line. The bit line is connected to memory cells arrayed in the row direction. The sense amplifier is connected to the bit line. Dummy cells are arrayed in the row direction between the row decoder and the memory cell array. The dummy bit line is connected to the dummy cells. The sense amplifier activation circuit transmits a sense start signal for setting a sense start timing to the sense amplifier through the signal interconnection. In this arrangement, the signal delay of the word line is set to be equal to that of the signal interconnection.

11 Claims, 4 Drawing Sheets

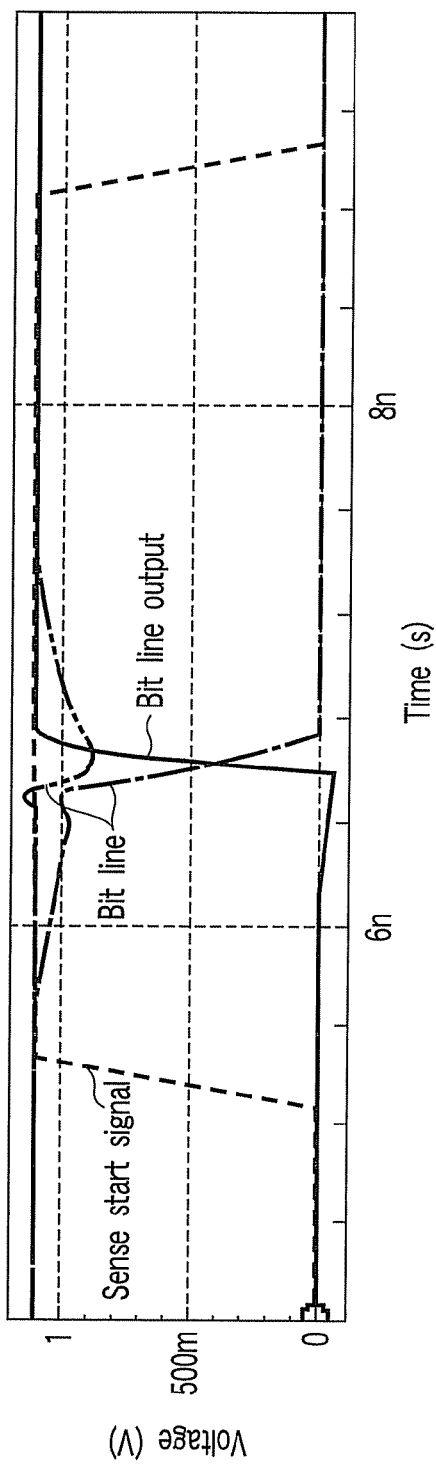
F I G. 6
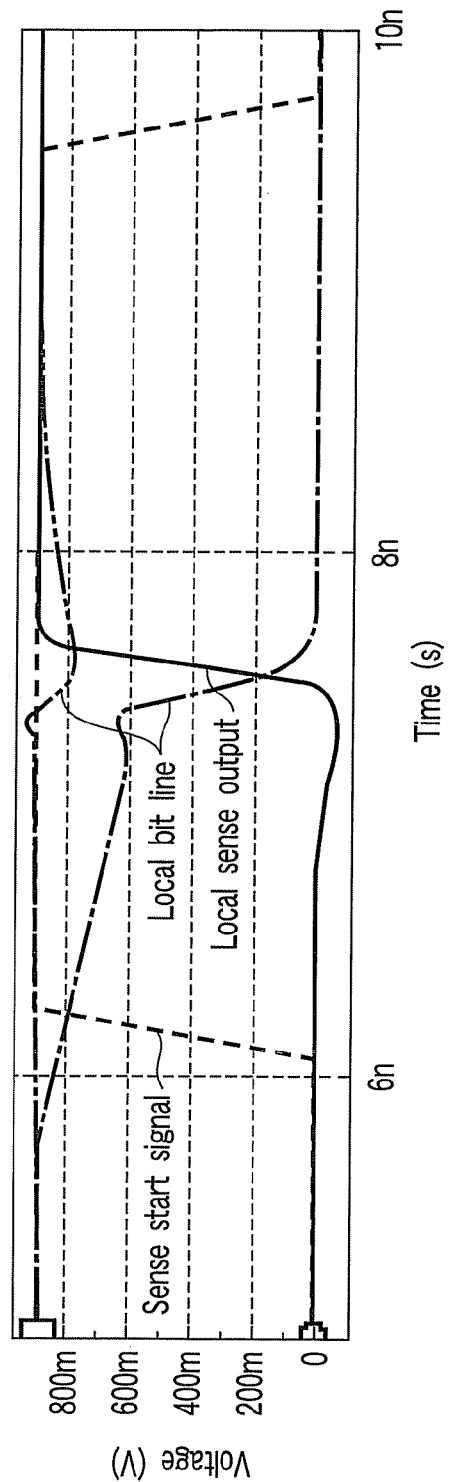
F I G. 7

SEMICONDUCTOR MEMORY DEVICE HAVING REPLICA CIRCUIT

CROSS-REFERENCE TO RELATED APPLICATIONS

This application is based upon and claims the benefit of priority from prior Japanese Patent Application No. 2006-320352, filed Nov. 28, 2006, the entire contents of which are incorporated herein by reference.

BACKGROUND OF THE INVENTION

1. Field of the Invention

The present invention relates to a semiconductor memory device having a replica circuit for controlling the sense timing of a sense amplifier.

2. Description of the Related Art

An example of a conventional semiconductor memory device having a replica circuit will be described.

In the replica circuit, a dummy word line connected to a dummy row decoder runs through dummy cells arrayed in the column direction and turns back. The dummy word line is then connected to dummy cells arrayed in the row direction through a dummy bit line and further connected to a local sense activation circuit through, e.g., an inverter. The turn-back is done in a distance half an actual word line (e.g., Jpn. Pat. Appln. KOKAI Publication No. 2002-56682).

The dummy word line reflects the actual word line length up to the farthest point. Hence, the dummy bit line reproduces the farthest bit line. The replica circuit determines the sense start timing, and generates a sense start signal (sense activation signal) and notifies the sense amplifier of the cell array of the start of sensing. For this reason, "dummy word line delay+ dummy bit line delay+inverter delay+interconnect delay up to sense amplifier" is necessary until a signal is transmitted to the farthest sense amplifier.

Conventionally, since the word lines are made of polysilicon and the necessary memory capacity is small, the interconnect delay up to the sense amplifier is so small as to be insignificant as compared to the dummy word line delay or dummy bit line delay. However, with the advance of process, the required memory capacity increases, and the material of word lines changes from polysilicon to a metal. Thus, although the dummy word line delay decreases, the interconnect delay up to the sense amplifier becomes equal to or more than the word line delay and cannot be neglected any more.

Additionally, after word line activation in the cell array, the potential difference between the pair of bit lines closest to the row decoder is different from that in the pair of bit lines farthest from the row decoder because of the interconnect delay up to the farthest sense amplifier. For example, assume that 512 cell arrays are arranged, and the farthest sense amplifier should start sensing when the potential difference between the pair of bit lines is 100 mV. In this case, however, the potential difference between the pair of bit lines reaches 130 mV because of the interconnect delay up to the sense amplifier.

FIG. 7 shows an example of the potential difference between the pair of bit lines in this operation. As shown in FIG. 7, when a potential difference $\Delta LBL$ in a pair of bit lines is 100 mV, the sense start signal is activated. However, the farthest pair of bit lines starts sensing with a considerably large potential difference because of the interconnect delay of the sense start signal. Although the large potential difference between the pair of bit lines is welcome from the viewpoint of a larger sense margin, it also limits the operation speed. For a faster operation, it is necessary to decrease the above-described interconnect delay up to the extra sense amplifier.

BRIEF SUMMARY OF THE INVENTION

According to a first aspect of the present invention, there is provided a semiconductor memory device comprising: a memory cell array which has a plurality of memory cells arrayed in row and column directions; a word line which is connected to the plurality of memory cells arrayed in the column direction; a row decoder which is connected to the word line; a bit line which is connected to the plurality of memory cells arrayed in the row direction; a sense amplifier which is connected to the bit line; a dummy cell array which has a plurality of dummy cells arrayed in the row direction and is arranged between the row decoder and the memory cell array; a dummy bit line which is connected to the plurality of dummy cells arrayed in the row direction; a sense amplifier activation circuit which outputs a sense start signal for setting a sense start timing of the sense amplifier in accordance with an output from the dummy bit line; and a signal interconnection which is arranged between the sense amplifier activation circuit and the sense amplifier to transmit the sense start signal. A signal delay of the word line is set to be equal to a signal delay of the signal interconnection which transmits the sense start signal.

According to a second aspect of the present invention, there is provided a semiconductor memory device comprising: a memory cell array which has a plurality of memory cells arrayed in row and column directions; a word line which is connected to the plurality of memory cells arrayed in the column direction; a row decoder which is connected to the word line; a bit line which is connected to the plurality of memory cells arrayed in the row direction; a sense amplifier which is connected to the bit line; a dummy cell array which has a plurality of dummy cells arrayed in the row direction and is arranged between the row decoder and the memory cell array; a dummy bit line which is connected to the plurality of dummy cells arrayed in the row direction; a control circuit which outputs an array control signal to control an operation of the sense amplifier in accordance with an output from the dummy bit line; and a signal interconnection which is arranged between the control circuit and the sense amplifier to transmit the array control signal. A signal delay of the word line is set to be equal to a signal delay of the signal interconnection which transmits the array control signal.

BRIEF DESCRIPTION OF THE SEVERAL VIEWS OF THE DRAWING

FIG. 6 is a timing chart showing the voltage waveforms of the farthest bit lines in the semiconductor memory device according to the embodiment of the present invention; and FIG. 7 is a timing chart showing the voltage waveforms of the farthest bit lines in the conventional semiconductor memory device.

DETAILED DESCRIPTION OF THE INVENTION

Figure 1:
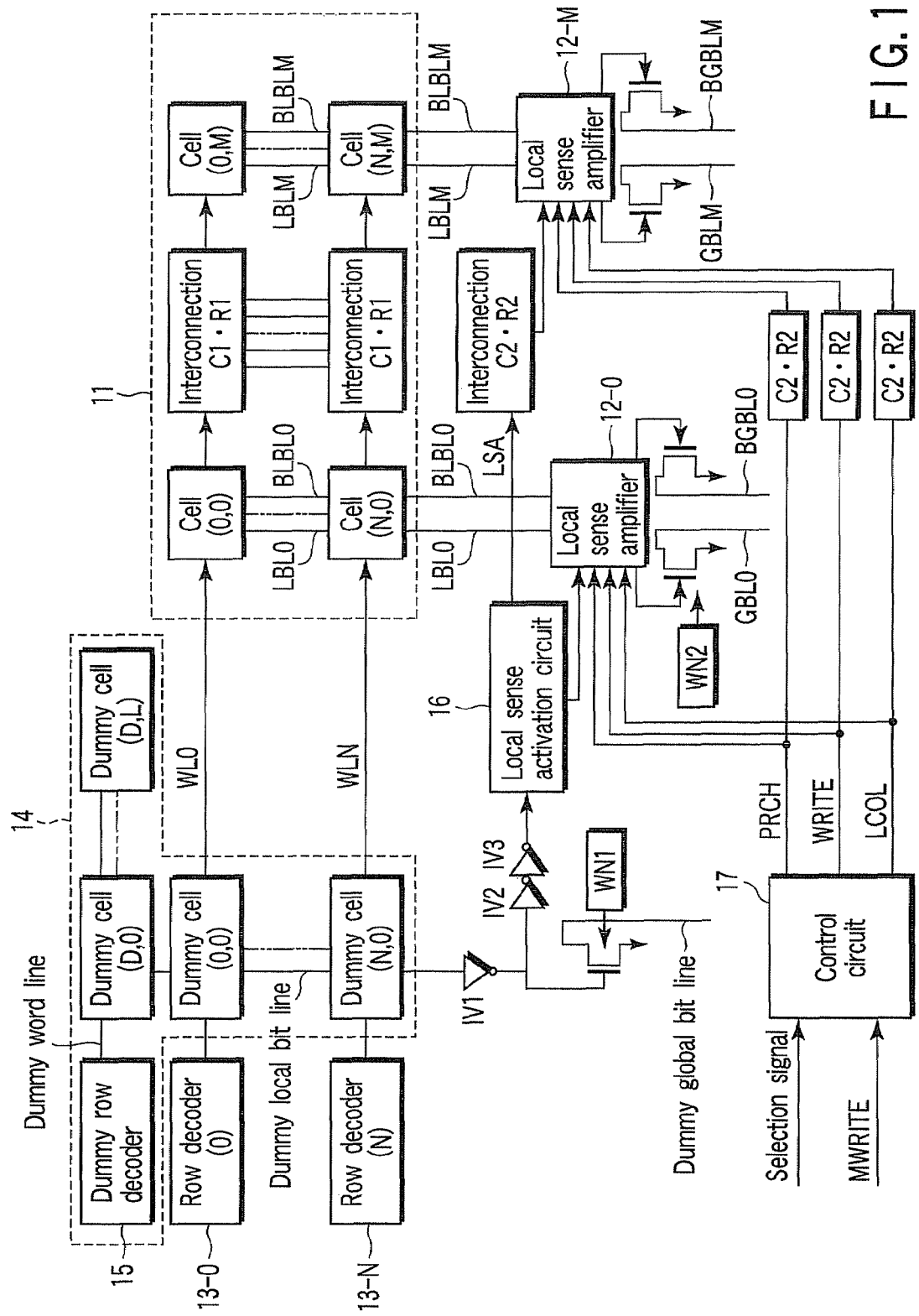
FIG. 1 is a block diagram showing the arrangement of a semiconductor memory device according to an embodiment of the present invention.

The embodiment of the present invention will be described below with reference to the accompanying drawing. The same reference numbers denote the same parts throughout the drawing.

FIG. 1 is a block diagram showing the arrangement of a semiconductor memory device according to an embodiment of the present invention. As shown in FIG. 1, a cell array 11 having (N+1) rows and (M+1) columns includes cells (0,0) to (N,M). (N+1) cells indicated by the cells (0,0) to (N,0) are connected to a pair of bit lines LBL0 and BLBL0. A local sense amplifier 12-0 is connected to an end of the pair of bit lines. Similarly, (N+1) cells are connected to the pair of bit lines of each of the subsequent columns. A local sense amplifier is connected to an end of each pair of bit lines. (N+1) cells indicated by the cells (0,M) to (N,M) are connected to a pair of bit lines LBLM and BLBLM of the final column. A local sense amplifier 12-M is connected to an end of the pair of bit lines LBLM and BLBLM. Each of the local sense amplifiers 12-0 to 12-M senses a selected memory cell connected to a pair of bit lines and reads data stored in the memory cell.

A replica circuit 14 is arranged between row decoders 13-0 to 13-N and the cell array 11. The replica circuit 14 includes a dummy array indicated by dummy cells (D,0) to (D,L) and dummy cells (0,0) to (N,0), a dummy word line connected to the dummy cells (D,0) to (D,L), a dummy row decoder 15 connected to the dummy word line, a dummy local bit line which is connected to the dummy cells (0,0) to (N,0), and a dummy global bit line which is connected to a drain of a transistor WN1 through the dummy cells (0,0) to (N,0).

The number of dummy cells (0,0) to (N,0) connected to a dummy bit line is (N+1), i.e., equal to the number of cells connected to a pair of bit lines. In the layout, the dummy cells (0,0) to (N,0) and the cells (0,0) to (N,0) are arranged in parallel. Hence, word lines WL0 to WLN run through the dummy cells (0,0) to (N,0) but are not connected to them.

To determine sense timing, the output of the dummy row decoder 15 is transmitted through a required number of dummy cells included in the dummy cells (D, 0) to (D, L), and is input to the dummy local bit line. The other dummy cells are kept inoperative. More specifically, the bit line covering the dummy cells (D, 0) to (D, L) is connected to the dummy local bit line. The dummy cells connected to the output of the dummy row decoder 15 are simultaneously turned on to thereby draw the potential of the dummy local bit line.

The dummy local bit line is connected to the gate of the transistor WN1 through an inverter IV1 and also connected to the input portion of a local sense activation circuit 16 through inverters IV2 and IV3. The output portion of the local sense activation circuit 16 is connected to the local sense amplifiers 12-0 to 12-M through a signal interconnection LSA. A transistor WN2 is connected to each of the local sense amplifiers 12-0 to 12-M.

Each of the word lines WL0 to WLN is connected to (M+1) cells and has a resistance R1 and capacitance C1. For example, the word line WL0 is connected to (M+1) cells including the cells (0,0) to (0,M). The word line WL0 has the resistance R1 determined by the thickness and width of the interconnect layer, and the capacitance C1 obtained by summing up the capacitance of the interconnect layer and the capacitance of the connected cells (0, 0) to (0, M). The word line WLN is connected to (M+1) cells including the cells (N,0) to (N,M). The word line WLN has the resistance R1 determined by the thickness and width of the interconnect layer, and the capacitance C1 obtained by summing up the capacitance of the interconnect layer and the capacitance of the connected cells (N, 0) to (N, M).

The signal interconnection LSA connected to the local sense activation circuit 16 is connected to the local sense amplifiers 12-0 to 12-M. The signal interconnection LSA has a resistance R2 determined by the thickness and width of the interconnect layer, and a capacitance C2 formed by the connected local sense amplifiers 12-0 to 12-M.

The replica circuit 14 reproduces the state of the local bit line (LBL0 in FIG. 1) closest to the row decoders 13-0 to 13-N. For example, the sense start timing of the local sense amplifier 12-0 connected to the closest cells (e.g., cells (0,0) to (N,0)) is set to start sensing when the potential difference (ΔLBL0) between the bit line LBL0 and the bit line BLBL0 is 100 mV. The sense start timing is adjusted by the number of dummy cells (D,0) to (D,L).

Even for the cells (e.g., cells (0,M) to (N,M)) farthest from the row decoders 13-0 to 13-N, the sense start timing of the local sense amplifier 12-M is set to start sensing when the potential difference between the local bit lines is 100 mV, like the closest cells. To do this, setting is done such that the signal transmission speed in the word line WL between the closest portion and the farthest portion equals the transmission speed of the sense start signal in the signal interconnection LSA between the closest portion and the farthest portion. That is, setting is done such that the product of the resistance R1 and capacitance C1 in each of the word lines WL0 to WLN equals the product of the resistance R2 and capacitance C2 in the signal interconnection LSA (R1×C1=R2×C2).

This shortens the above-described conventional delay until a signal is transmitted to the farthest local sense amplifier 12-M, i.e., "dummy word line delay+dummy bit line delay+inverter delay+interconnect delay up to local sense amplifier" to "dummy bit line delay+inverter delay+interconnect delay up to local sense amplifier". It is therefore possible to speed up the operation by an amount corresponding to the delay in the word line.

In the above-described example, the resistance and capacitance of the interconnect for the sense start signal (sense activation signal) is equalized with those of the word line. The resistance and capacitance of each of interconnects for array control signals including not only the sense start signal but also a bit line precharge signal, local bit line write signal, and local bit line selection signal are equalized with those of the word line.

This will be described in detail. As shown in FIG. 1, a control circuit 17 receives a selection signal (e.g., row address signal) and main write signal MWRITE and outputs a bit line precharge signal PRCH, local bit line write signal WRITE, and local bit line selection signal LCOL to the local sense amplifiers 12-0 to 12-M. Each of the interconnects of the bit line precharge signal PRCH, local bit line write signal WRITE, and local bit line selection signal LCOL has, e.g., the resistance R2 and capacitance C2. Setting is done such that the product of the resistance R2 and capacitance C2 in each interconnect equals the product of the resistance R1 and capacitance C1 in each of the word lines WL0 to WLN (R1×C1=R2×C2). The array control signals including the sense start signal, bit line precharge signal, local bit line write signal, and local bit line selection signal are output to the local sense amplifiers in accordance with the outputs from the dummy bit lines.

Figure 2:
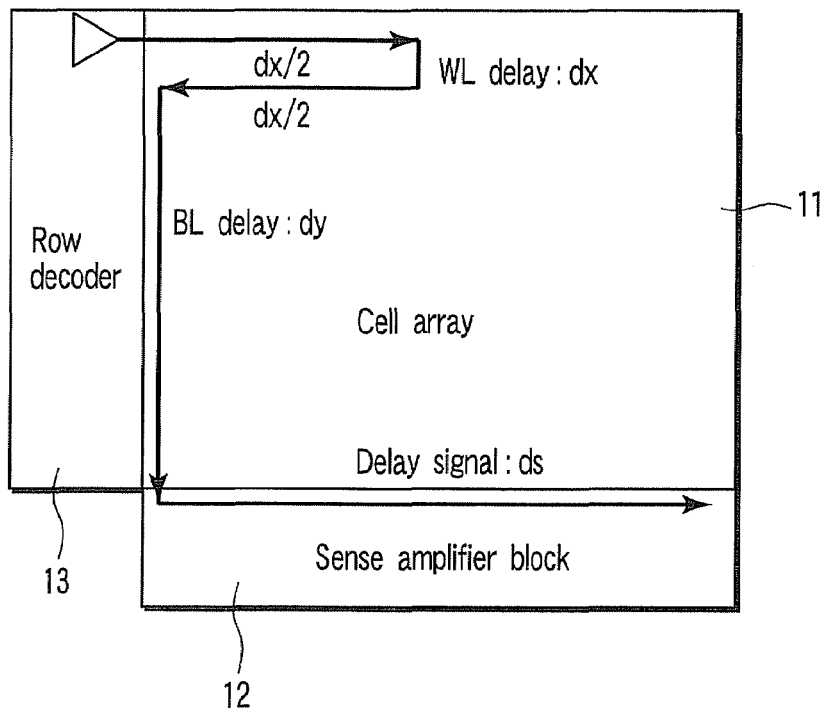
FIG. 2 is a schematic view showing a sense timing setting method in a conventional semiconductor memory device having a replica circuit.
Figure 3:
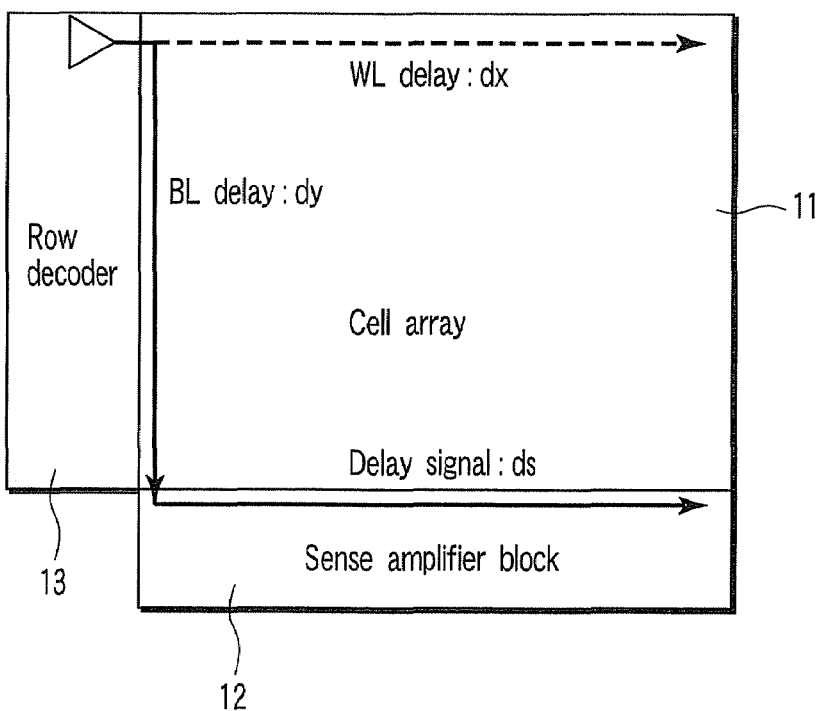
FIG. 3 is a schematic view showing a sense timing setting method in the semiconductor memory device having a replica circuit according to the embodiment of the present invention.

FIG. 2 is a schematic view showing a sense timing setting method in the conventional semiconductor memory device having a replica circuit. FIG. 3 is a schematic view showing a sense timing setting method in the semiconductor memory device having a replica circuit according to the embodiment of the present invention.

The row decoder 13 and sense amplifier block 12 are arranged in the cell array 11. In the prior art, for example, the activation timing of the sense amplifier is generated by adjusting the sense start timing in the farthest cells by using a delay (dx+dy), i.e., the sum of a delay dx of a word line and a delay dy of a bit line in the replica circuit, as shown in FIG. 2. However, when the storage capacity of the cell array 11 increases to, e.g., the order of megabits or more, a delay ds in the signal interconnection LSA that propagates the sense start signal for sense amplifier activation changes to an extra margin for sense timing.

To prevent this, the delay ds of the sense start signal is equalized with the delay dx in the word line, and the sense start timing by the sense amplifier block 12 is determined by the delay (delay dy of bit line+delay ds of signal interconnection LSA), as shown in FIG. 3. This allows each sense amplifier to perform sensing at an optimum timing synchronized with the word line delay.

An example will be described next in which the product (CR) of the capacitance and resistance of a word line connected to a row decoder is equalized with that of the capacitance and resistance of the signal interconnection LSA connected to the local sense activation circuit 16 so that the sense start signal delay ds becomes equal to the word line delay dx.

Figure 4:
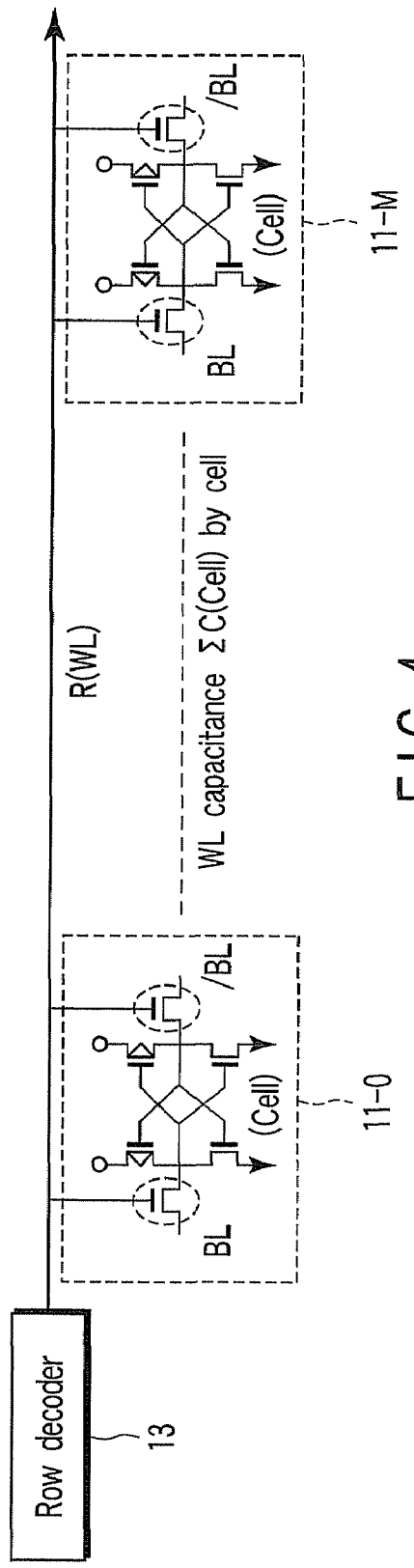
FIG. 4 is a schematic view showing the resistance and capacitance of a word line connected to a row decoder in the semiconductor memory device according to the embodiment of the present invention.
Figure 5:
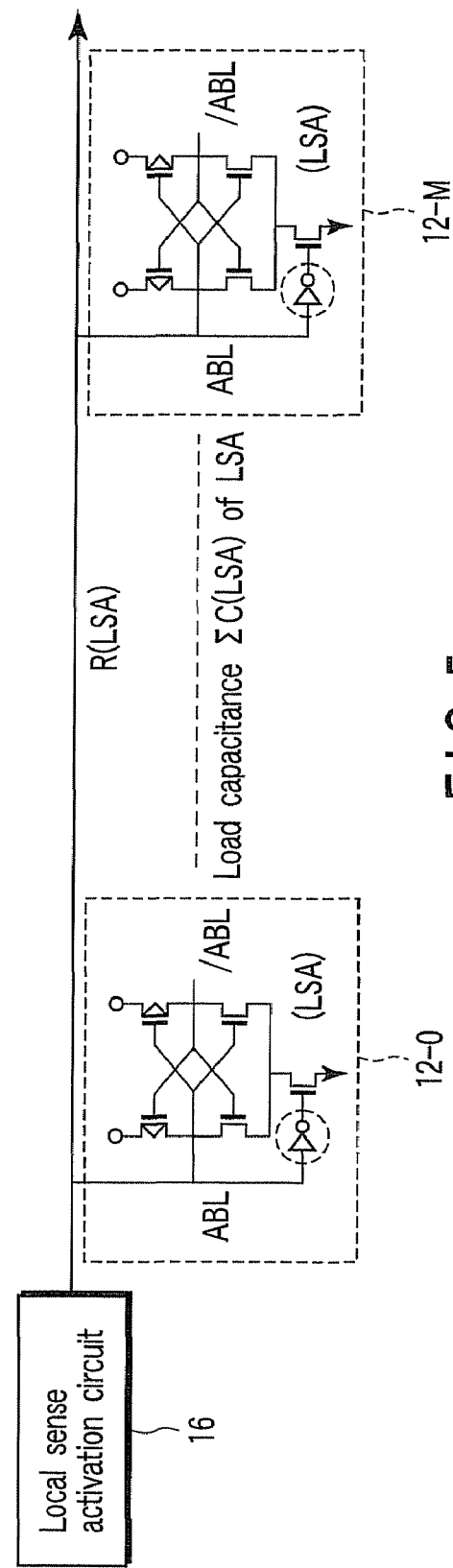
FIG. 5 is a schematic view showing the resistance and capacitance of a signal interconnection connected to a local sense activation circuit in the semiconductor memory device according to the embodiment of the present invention.

FIG. 4 shows the resistance and capacitance of the word line WL connected to the row decoder 13. FIG. 5 shows the resistance and capacitance of the signal interconnection LSA connected to the local sense activation circuit 16. The word line WL has a resistance R(WL) and a capacitance ΣC(cell) formed by cells 11-0 to 11-M, as shown in FIG. 4. On the other hand, the signal interconnection LSA has a resistance R(LSA) and a capacitance ΣC(LSA) formed by the local sense amplifiers 12-0 to 12-M, as shown in FIG. 5. Hence, the resistances and capacitances are set such that [resistance R(Wl)×capacitance ΣC(cell)]=[resistance R(LSA)×capacitance ΣC(LSA)] holds.

For example, the thickness and width of the interconnect layer of the word line WL are equalized with those of the interconnect layer of the signal interconnection LSA so that resistance R(Wl)=resistance R(LSA) holds. In addition, the dimensions of a buffer circuit and, for example, the dimensions of an inverter in each local sense amplifier are adjusted so that the capacitance ΣC(cell) of the word line WL equals the capacitance ΣC(LSA) of the signal interconnection LSA.

Alternatively, [resistance R(Wl)×capacitance ΣC(cell)] of the word line WL may be equalized with [resistance R(LSA)× capacitance ΣC(LSA)] of the signal interconnection LSA by adjusting only the capacitance ΣC(cell) of the word line WL and the capacitance ΣC(LSA) of the signal interconnection LSA without equalizing the resistance R(WL) of the word line WL with the resistance R(LSA) of the signal interconnection LSA. The above-described setting enables each sense amplifier to perform sensing at an optimum timing synchronized with the word line delay.

The methods of equalizing the delay ds of the signal interconnection LSA (sense start signal) with the delay dx of the word line will be summarized below.

(1) When the total capacitance connected to the signal interconnection LSA that propagates the sense start signal equals the total capacitance connected to the word line WL, the thickness and width of the interconnect layer of the signal interconnection LSA are equalized with those of the interconnect layer of the word line WL so that the signal interconnection LSA and word line WL have the same resistance.

(2) When the total capacitance connected to the signal interconnection LSA is larger than the total capacitance connected to the word line WL, the width of the signal interconnection LSA is made more than that of the word line WL. In addition, a buffer circuit is inserted between the signal interconnection LSA and the gate of each sense amplifier, thereby suppressing the gate capacitance of the signal interconnection LSA.

(3) When the total capacitance connected to the signal interconnection LSA is smaller than the total capacitance connected to the word line WL, the width of the signal interconnection LSA is made less than that of the word line WL. In addition, a dummy capacitance is added to the signal interconnection LSA.

FIG. 6 shows the voltage waveforms of the farthest bit lines in the semiconductor memory device according to the embodiment of the present invention. FIG. 7 shows the voltage waveforms of the farthest bit lines in the prior art. As shown in FIG. 6, when the potential difference between the pair of bit lines is 100 mV, the sense amplifier starts sensing. This achieves a speedup of 1 ns, i.e., increases the speed by 1 ns, as compared to FIG. 7. The same effect can be obtained even by applying the embodiment of the present invention to a device having a layered bit line structure.

In this embodiment, the replica circuit which copies the difference between the bit lines on the row decoder side determines the sense start timing. The interconnect delay for the sense start timing from the vicinity of the row decoder to the farthest portion is equalized with the word line delay in the memory array. This makes it possible to always execute sensing at the same timing independently of the distance from the row decoder to a memory cell. Additionally, reduction of an extra delay allows the cycle time to be shortened and the speed increased.

The replica circuit that copies bit lines on the row decoder side sets the timing of the sense amplifier activation signal. Additionally, the delay of the sense start signal is set to equalize the word line signal transmission speed with the sense start signal transmission speed so that sensing is always executed under the same condition of the difference between a pair of bit lines. The sense start signal is the signal transmitted through the signal interconnection LSA.

As described above, according to the embodiment of the present invention, it is possible to provide a semiconductor memory device capable of always causing a sense amplifier to sense a memory cell at the same timing independently of the distance from the row decoder to the sense amplifier (or memory cell) and increasing the operation speed.

According to the embodiments of the present invention, it is possible to provide a semiconductor memory device capable of always sensing a memory cell at the same timing independently of the distance from the row decoder to a sense amplifier and increasing the operation speed.

The above-described embodiment is not only embodiment, and various embodiments can be formed by changing the above-described elements or adding various elements.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A semiconductor memory device comprising:
a memory cell array which has a plurality of memory cells arrayed in row and column directions;
a word line which is connected to the plurality of memory cells arrayed in the column direction;
a row decoder which is connected to the word line;
a bit line which is connected to the plurality of memory cells arrayed in the row direction;
a sense amplifier which is connected to the bit line;
a dummy cell array which has a plurality of dummy cells arrayed in the row direction and is arranged between the row decoder and the memory cell array;
a dummy bit line which is connected to the plurality of dummy cells arrayed in the row direction;
a sense amplifier activation circuit which outputs a sense start signal for setting a sense start timing of the sense amplifier in accordance with an output from the dummy bit line; and
a signal interconnection which is arranged between the sense amplifier activation circuit and the sense amplifier to transmit the sense start signal,
wherein a signal delay of the word line is set to be equal to a signal delay of the signal interconnection which transmits the sense start signal.

2. The device according to claim 1, wherein a product of a resistance and a capacitance of the word line equals a product of a resistance and a capacitance of the signal interconnection.

3. The device according to claim 1, wherein
the sense amplifier includes a buffer circuit connected to the signal interconnection, and
dimensions of the buffer circuit are set to make a product of a resistance and a capacitance of the word line equal a product of a resistance and a capacitance of the signal interconnection.

4. The device according to claim 2, wherein an interconnect layer of the word line and that of the signal interconnection have the same thickness and width.

5. The device according to claim 4, wherein the word line and the signal interconnection have the same capacitance.

6. A semiconductor memory device comprising:
a memory cell array which has a plurality of memory cells arrayed in row and column directions;
a word line which is connected to the plurality of memory cells arrayed in the column direction;
a row decoder which is connected to the word line;
a bit line which is connected to the plurality of memory cells arrayed in the row direction;
a sense amplifier which is connected to the bit line;
a dummy cell array which has a plurality of dummy cells arrayed in the row direction and is arranged between the row decoder and the memory cell array;
a dummy bit line which is connected to the plurality of dummy cells arrayed in the row direction;
a control circuit which outputs an array control signal to control an operation of the sense amplifier in accordance with an output from the dummy bit line; and
a signal interconnection which is arranged between the control circuit and the sense amplifier to transmit the array control signal,
wherein a signal delay of the word line is set to be equal to a signal delay of the signal interconnection which transmits the array control signal.

7. The device according to claim 6, wherein a product of a resistance and a capacitance of the word line equals a product of a resistance and a capacitance of the signal interconnection.

8. The device according to claim 6, wherein
the sense amplifier includes a buffer circuit connected to the signal interconnection, and
dimensions of the buffer circuit are set to make a product of a resistance and a capacitance of the word line equal a product of a resistance and a capacitance of the signal interconnection.

9. The device according to claim 7, wherein an interconnect layer of the word line and that of the signal interconnection have the same thickness and width.

10. The device according to claim 9, wherein the word line and the signal interconnection have the same capacitance.

11. The device according to claim 6, wherein the array control signal includes at least one of a bit line precharge signal, a bit line write signal, and a bit line selection signal.

* * * * *